United States Patent
Jerez

(10) Patent No.: US 8,319,410 B2
(45) Date of Patent: Nov. 27, 2012

(54) CATHODE ION SOURCE

(75) Inventor: Manuel A. Jerez, Roosevelt, NY (US)

(73) Assignee: Ion Technology Solutions, LLC, Mineola, NY (US)

( * ) Notice: Subject to any disclaimer, the term of this patent is extended or adjusted under 35 U.S.C. 154(b) by 379 days.

(21) Appl. No.: 12/655,347

(22) Filed: Dec. 29, 2009

(65) Prior Publication Data
US 2011/0156570 A1 Jun. 30, 2011

(51) Int. Cl.
*H01J 27/00* (2006.01)
*H01J 19/42* (2006.01)
*H01J 19/44* (2006.01)

(52) U.S. Cl. ........ 313/275; 313/271; 313/238; 313/292; 313/230; 313/359.1

(58) Field of Classification Search .................. None
See application file for complete search history.

(56) References Cited

U.S. PATENT DOCUMENTS

| | | | | |
|---|---|---|---|---|
| 2,677,060 | A * | 4/1954 | Woodward et al. | 250/425 |
| 6,768,121 | B2 * | 7/2004 | Horsky et al. | 250/427 |
| 7,586,101 | B2 * | 9/2009 | Murrell et al. | 250/426 |
| 2010/0320395 | A1 * | 12/2010 | Hahto et al. | 250/426 |
| 2012/0013249 | A1 * | 1/2012 | Jerez | 313/613 |

* cited by examiner

*Primary Examiner* — Natalie Walford
(74) *Attorney, Agent, or Firm* — Francis C. Hand; Carella, Byrne, et al

(57) ABSTRACT

The filament clamp assembly has a pair of bifurcated clamps to hold the connecting leads of a filament within a cavity of a cathode of a separate cathode assembly. The filament clamp assembly is mounted on the insulator block in self-aligning relation. The cathode assembly has a tungsten cathode with an internal cavity to receive the filament that is secured within a retainer shield made of one of tungsten, molybdenum and graphite by a threaded graphite cylindrical collar.

14 Claims, 6 Drawing Sheets

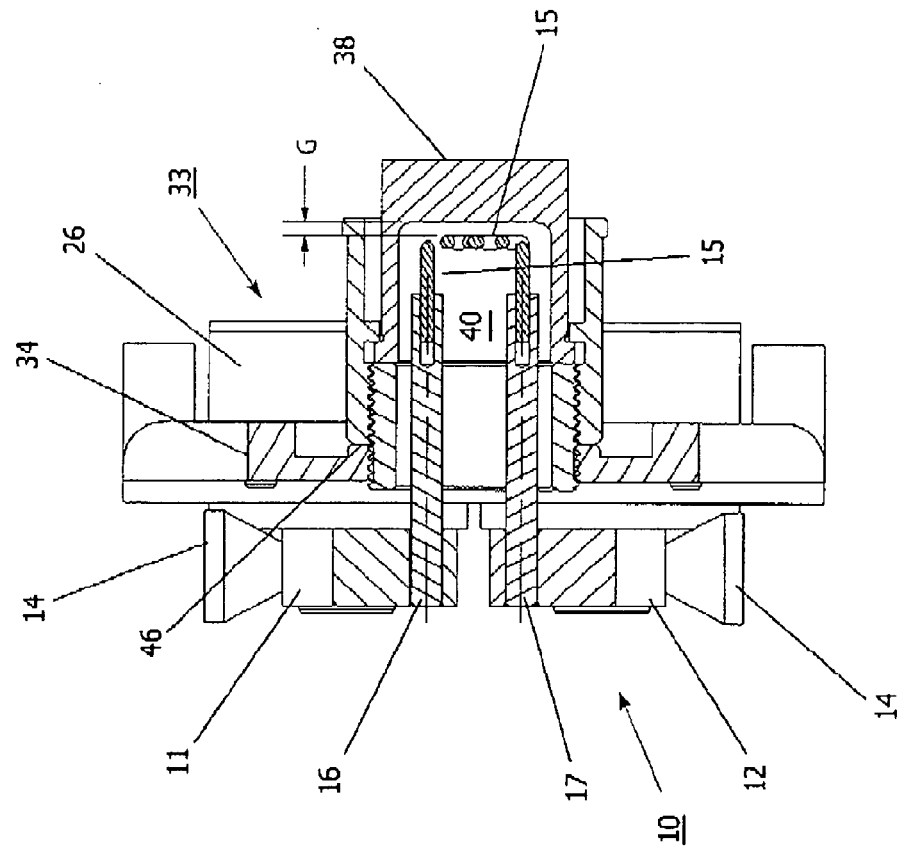
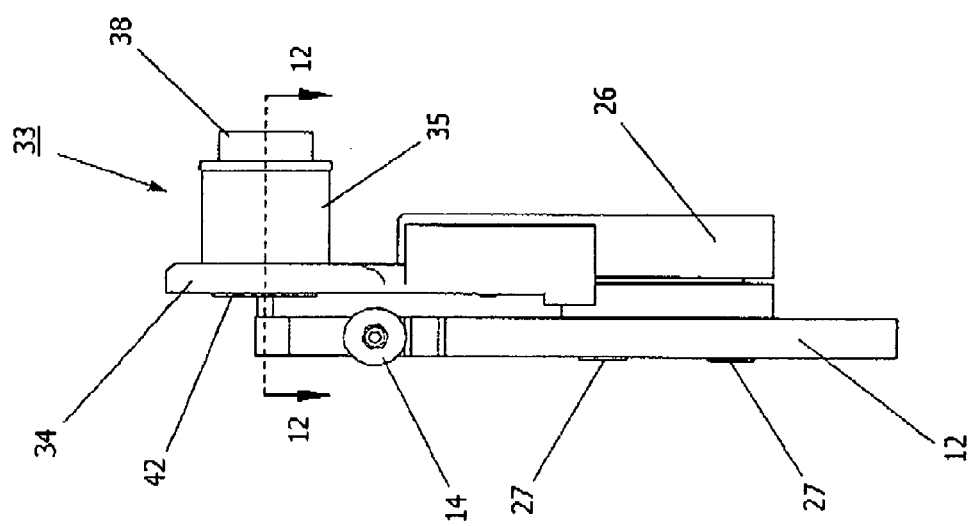

CATHODE ION SOURCE

This invention relates to a cathode ion source. More particularly, this invention relates to a filament clamp assembly for a cathode ion source. Still more particularly, this invention relates to a filament clamp assembly and cathode assembly for a cathode ion source.

As is known, ion sources are typically constructed with an indirectly heated cathode assembly and a filament for heating the cathode. Examples of such ion sources are known from U.S. Pat. No. 7,586,101.

In the manufacture of semi-conductors, ion implanters are widely used to diffuse or implant positive ions onto regions of the semi-conductor wafer. It is the ion source that generates the ion beam used to implant the semi-conductor wafers.

As is known in the art, an indirectly heated cathode ion source includes an arc chamber, cathode assembly, filament, insulator block, graphite support plate, and a filament clamp assembly. The filament is positioned within a cavity defined by the cathode. The cathode is heated by an electron bombardment from the filament; the cathode in turn emits electrons thermionically within the arc/plasma chamber. Assembly and position of the filament with respect to the cathode is critical to the performance, efficiency, and life expectancy of the ion source. U.S. Pat. Nos. 5,886,355; 7,138,768 and 7,365,339 describe several devices for mounting a filament in place.

As is known in the art, filaments that are employed in an ion implanter have been made with a pair of legs that function as connecting leads and a loop that extends between the legs. In some cases, the two electrically isolated legs of the filament are captured by a first and second filament clamp. These clamps typically employ a cam operation or setscrew to open integral jaws on the clamps for accepting the filament leads. The leads are in turn held by the spring force developed by the clamping jaws. Due to the extreme temperatures reached by the filament during operation, the clamping jaws will relax over time and take a permanent set. The electrical connection to the filament is thereby compromised and the ion source is in need of repair or replacement, resulting in repeated and extended periods of downtime for the implanter.

It has also been known, to have the cathode and filament clamps attached to an electrical/thermal insulator block. The filament/clamp assembly is typically attached to the insulator block with pan head machine screws. The assembly is positioned such that the filament is centrally located within the cavity of the cathode. The pan head machine screws are then tightened to hold the assembly in place. The proper position of the filament depends on the skill of the operator and/or the need to employ an assembly fixture. Improper assembly will result in an electric short between the filament and cathode rendering the ion source in-operable. A minimum gap between the filament and cathode must also be met to ensure maximum life expectancy for the ion source.

It is an object of this invention to improve the lifetime and manufacture of an ion source as well as reducing the downtime for servicing the ion implanter.

It is another object of this invention to provide a secure repeatable clamp assembly to hold the filament of an ion source.

It is another object of this invention to provide a filament clamp assembly which is self aligning to the cathode assembly of an ion source.

It is another object of this invention to reduce the complexity of the filament clamp assembly of an ion source.

It is another object of this invention to provide a filament clamp assembly that is retrofitable to various existing ion implanters.

It is another object of this invention to reduce the heat loss from the cathode of an ion implanter thereby reducing the heat loss from an arc chamber and increasing the efficiency of the arc chamber.

It is another object of this invention to increase the efficiency and lifetime of a filament of an ion implanter.

It is another object of this invention to provide a cathode assembly for an ion implanter that is self-positioning.

Briefly, the invention provides a filament clamp assembly comprised of a pair of clamps that are disposed in parallel relation for receiving a filament having a pair of connecting leads and a loop extending between the connecting leads In accordance with the invention, each clamp has a bifurcated end that defines a slot and includes a first half having a threaded bore and a first recess in an end thereof and a second half having a through bore in alignment with the threaded bore and a second recess in an end thereof parallel to the first recess.

The clamp assembly also has a pair of socket head set screws, each of which is threaded into the threaded bore of a respective clamp and which extends outwardly of the through bore of the respective clamp.

The clamp assembly also has a pair of socket head nuts each of which is threaded onto a respective set screw and into abutment with a respective clamp.

In response to threading of a socket head nut onto a set screw and abutment against a clamp, the two halves of a clamp move toward each other to narrow slot therebetween and move the two recesses towards each other to clamp a connecting lead of the filament therebetween.

The invention further provides a cathode assembly comprised of a retainer shield, cathode and collar. The retainer shield is made of one of tungsten, molybdenum and graphite, the cathode is made of tungsten and the collar is made of graphite.

The retainer shield defines a passage of circular cross-section and has a threaded bore at one end of the passage and a radially directed rib within the passage.

The cathode is of cylindrical cross-sectional shape and extends into the retainer shield. The cathode has an internal cavity at one end of cylindrical cross-section that terminates in an end wall as well as an annular flange at one end that surrounds the entrance to the cavity and extends radially outwardly thereof to abut the rib of the retainer shield. The outer surface of the cathode is a smooth unthreaded outer surface.

The collar is threaded into the bore of the retainer shield against the cathode to secure the flange of the cathode between the internal rib of the shield and the collar thereby securing the cathode in place within and concentrically of the passage of the retainer shield.

The invention also provides an ion implanter comprised of a cathode assembly, a filament clamp assembly secured to said cathode assembly and a filament.

As above, the cathode assembly includes a retainer shield defining a passage having a threaded bore at one end and a radially directed rib within the passage, a cathode extending into the shield and having an annular flange abutting the rib of the shield and a cavity at one end; and a collar threaded into the bore of the shield against the cathode to secure the flange of the cathode between the rib of the shield and the collar.

The filament has a pair of parallel connecting leads secured in and extending from the clamp assembly into the cavity of the cathode and a loop extending between the connecting leads within the cavity of the cathode. The filament is disposed in the cavity of the cathode coaxially of the cathode.

The cathode has an end wall defining an end of the cavity and the loop of the filament is spaced from the end wall a distance of 0.04 inches.

These and other objects and advantages of the invention will become more apparent from the following description taken in conjunction with the accompanying drawings wherein:

FIG. 11 is a side view of the filament and cathode assembly of FIG. 5; and

FIG. 12 is a view taken on line 12-12 of FIG. 11 of the filament and cathode assembly.

Figure 1:
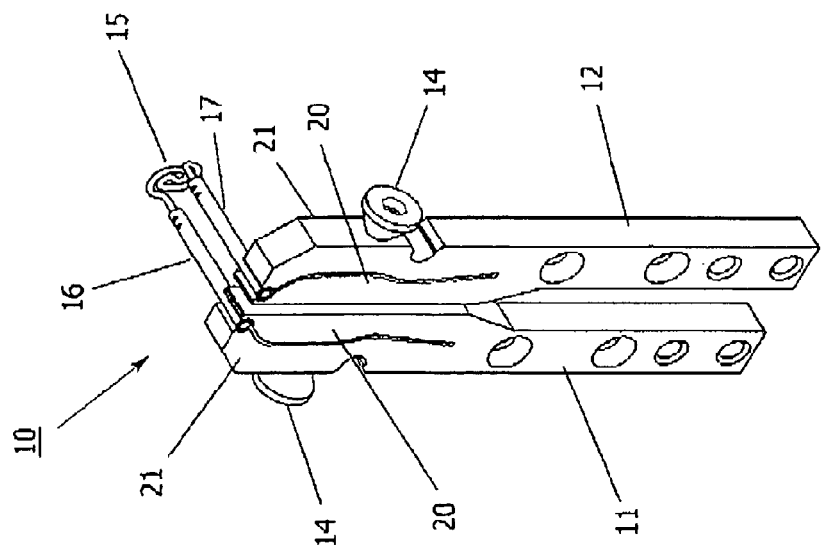
FIG. 1 is an exploded perspective view of the filament clamp assembly in accordance with the invention.
Figure 2:
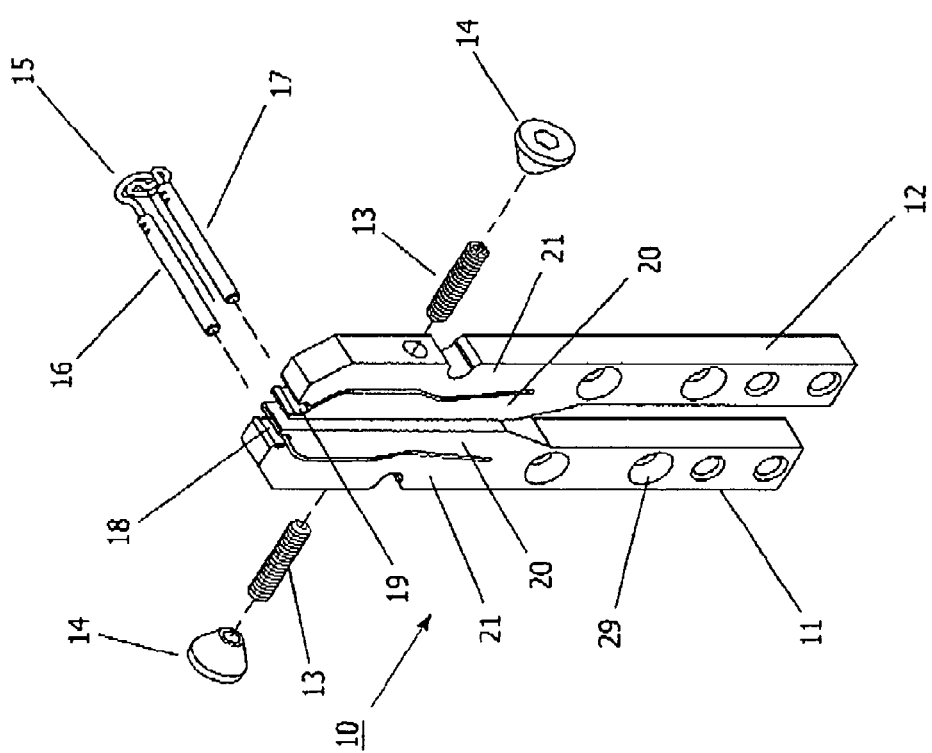
FIG. 2 is an assembled perspective view of the filament clamp assembly of FIG. 1.

Referring to FIGS. 1 to 4, the filament clamp assembly 10 has a pair of clamps 11, 12 disposed in parallel relation, a pair of socket head set screws 13 and a pair of socket head nuts 14 for the mounting of a filament 15 having a pair of parallel connecting leads 16, 17.

Figure 3:
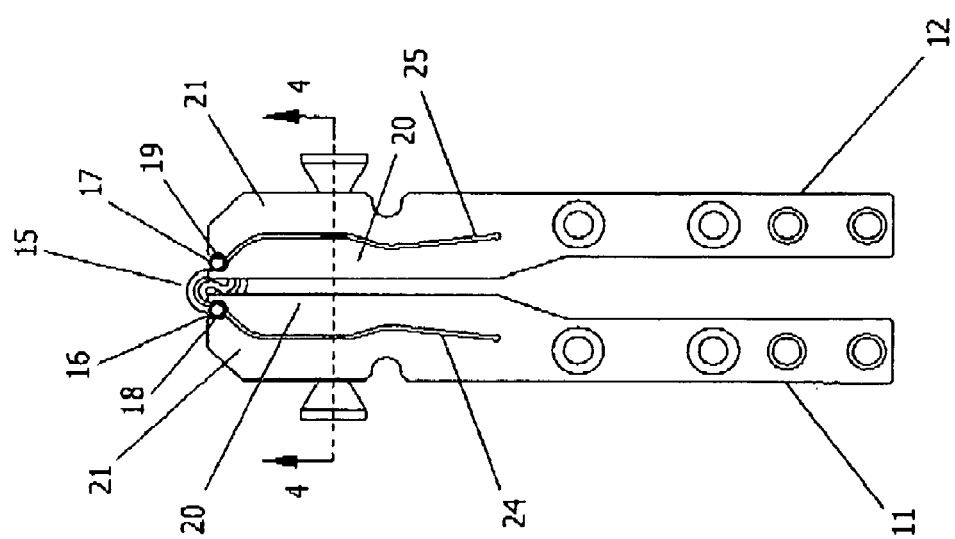
FIG. 3 is a front view of the filament clamp assembly of FIG. 1.

As shown in FIG. 3, each clamp 11, 12 has a bifurcated end formed of an inside half 20 and an outside half 21 that define a slot 24, 25 therebetween.

Figure 4:
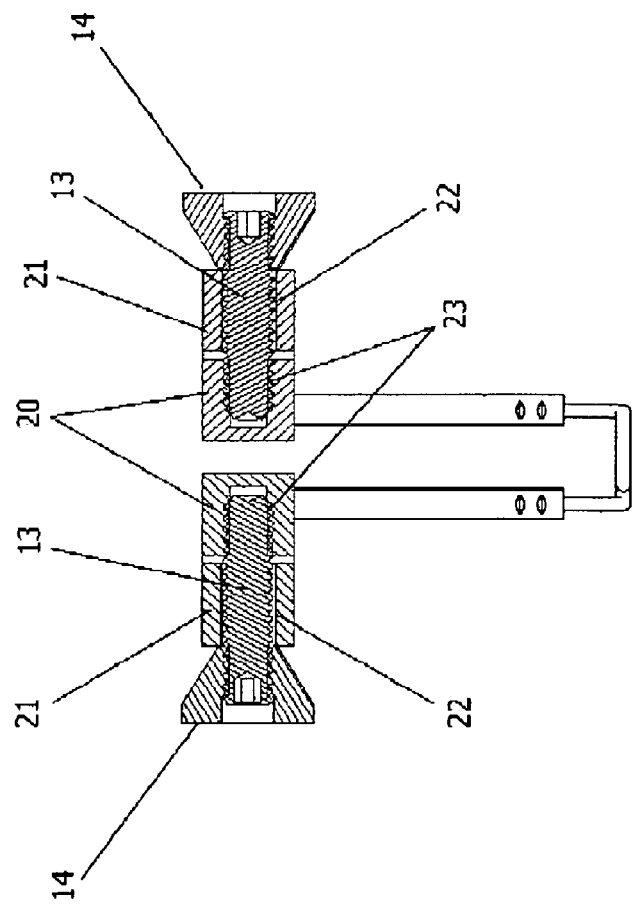
FIG. 4 is a view taken on line 4-4 of FIG. 3 of the filament clamp assembly.

As shown in FIG. 4, the inside half 20 of each clamp 11, 12 has a threaded bore 23 to accept a set screw 13 while the outside half 21 has a through bore 22 in alignment with said threaded bore 23 for passage of the set screw 13.

As shown in FIGS. 1 and 3, each half 20, 21 of each clamp 11, 12 has a recess 18, 19 in an end thereof. These recesses 18, 19 are parallel to accept the two connecting leads 16, 17 of the filament 15.

As shown in FIGS. 1 and 4, the socket head nuts 14 are tapered and thread onto the set screws 13. When tightened into abutment with a respective clamp 11, 12, the socket head nuts 14 cause the two halves 20, 21 of each clamp to move towards each other to narrow the respective slot 24, 25 therebetween and to move the recesses 18, 19 towards each other to create a clamping force on a respective connecting lead 16, 17 of the filament 15.

Figure 5:
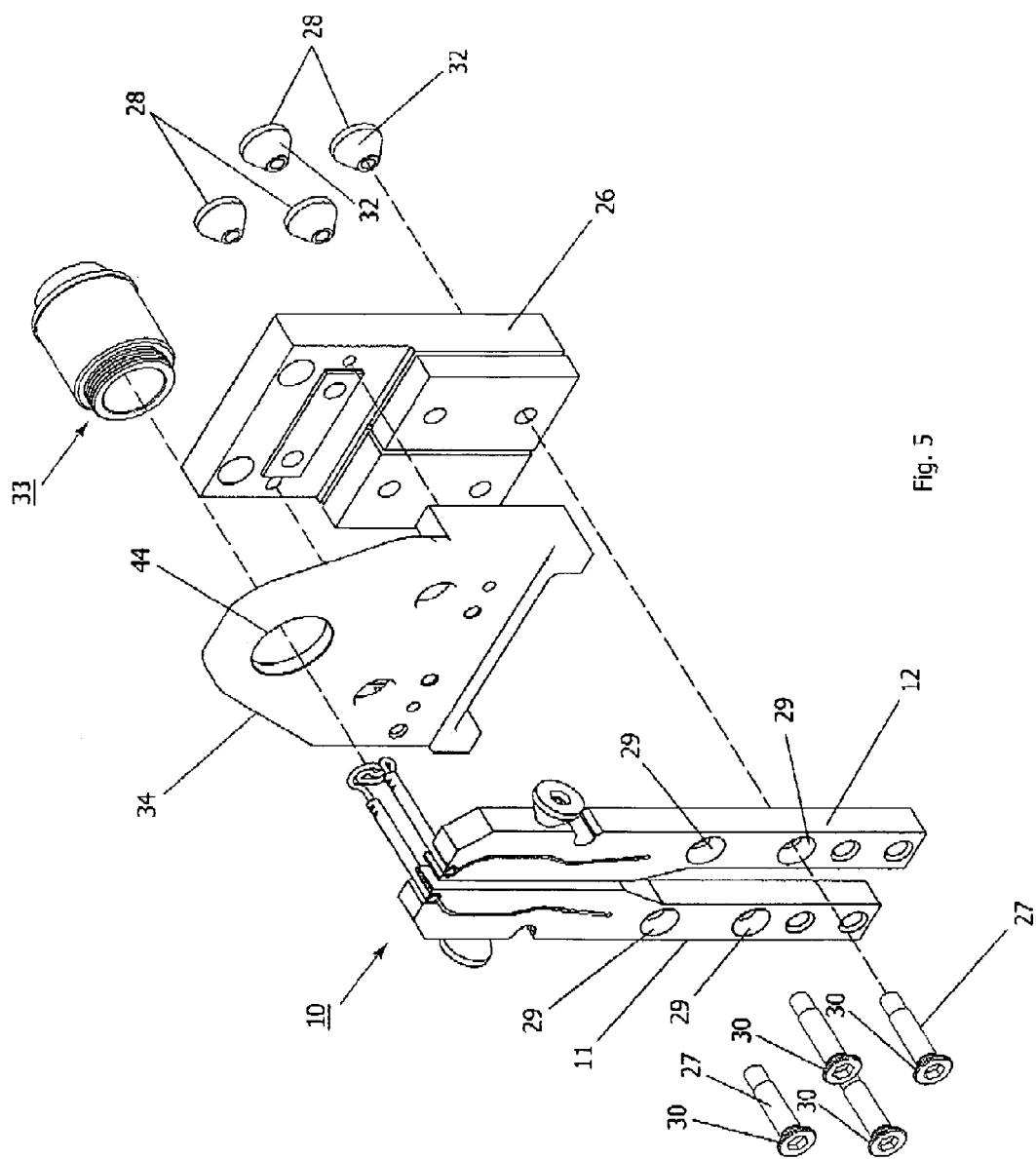
FIG. 5 is an exploded perspective view of a filament and cathode assembly in accordance with the invention.
Figure 7:
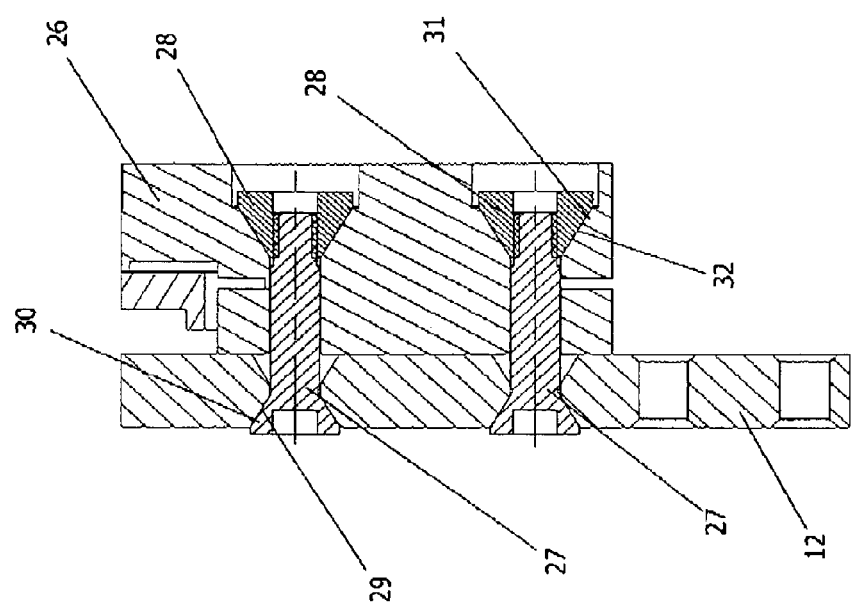
FIG. 7 is view taken on line 7-7 of FIG. 6.
Figure 6:
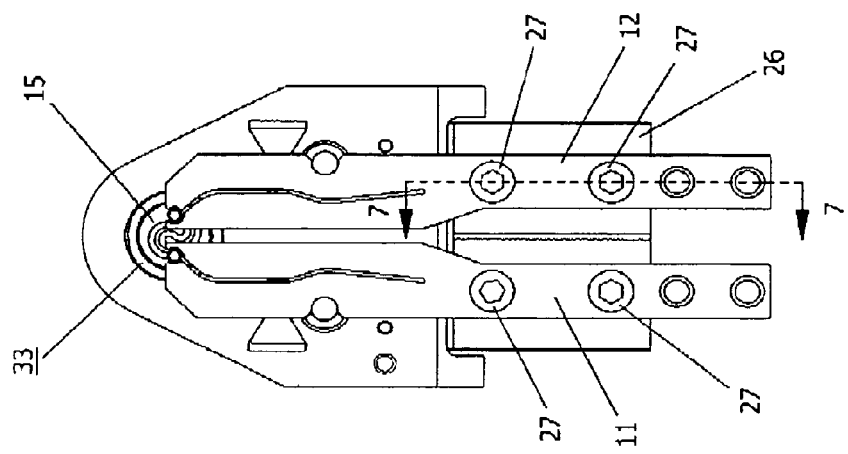
FIG. 6 is a front view of the filament and cathode assembly of FIG. 5.

Referring to FIGS. 5 to 7, the filament clamp assembly 10 is assembled to an insulator block 26 in self-aligning relation with four flat socket head screws 27 and four tapered socket head nuts 28. To this end, as indicated in FIG. 7, each clamp 11,12 has openings with a tapered entry surface 29 and a tapered/conical surface 30 on each flat socket head screw 27 mates with a tapered surface 29 on the filament clamps 11, 12. The insulator block 26 has a plurality of openings for the passage of the screws 27 and each passage has a counter-bored section with a tapered surface 31. Each socket head nut 28 has a tapered surface 32 that mates with a tapered surface 31 on the insulator block 26.

Referring to FIG. 5, a cathode assembly 33 is also assembled via a graphite support plate 34 with the filament clamp assembly 10 to the insulator block 26.

Figure 8:
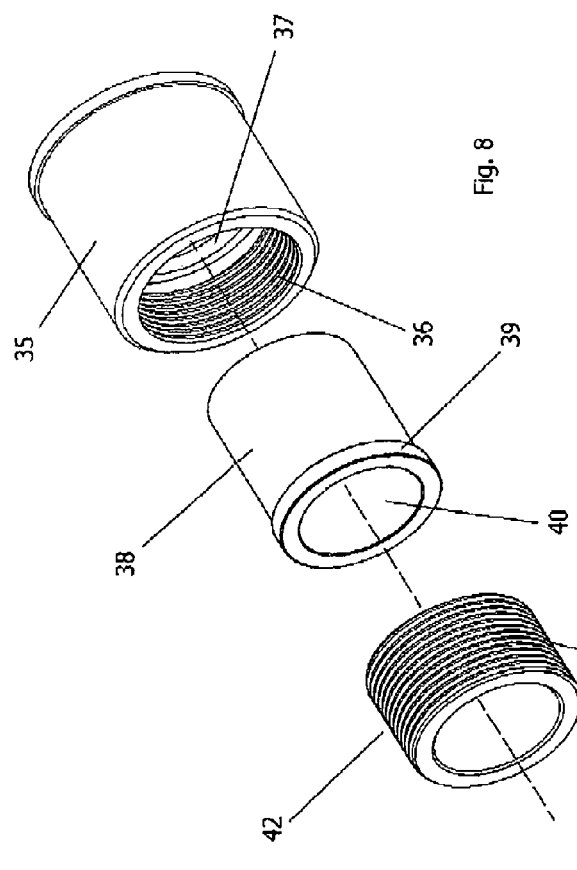
FIG. 8 is an exploded perspective view of the cathode assembly of FIG. 5.
Figure 10:
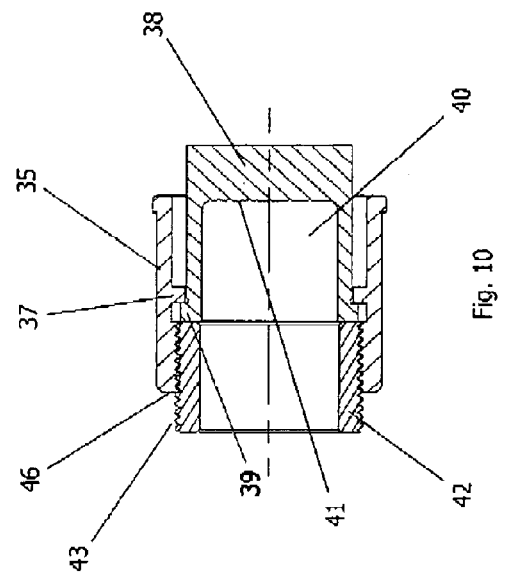
FIG. 10 is cross sectional view of the cathode assembly taken on line 10-10 of FIG. 9.
Figure 9:
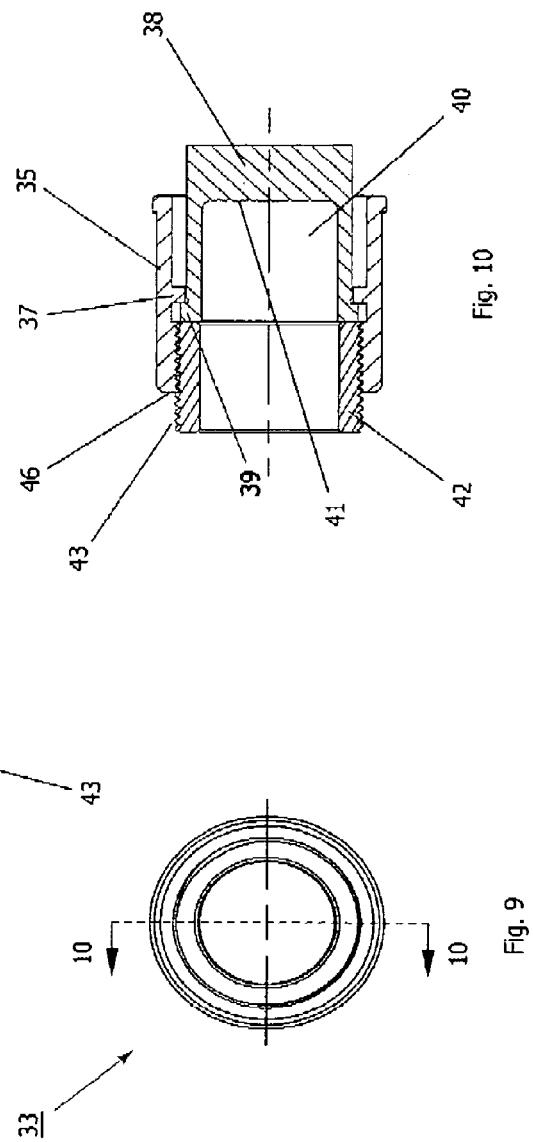
FIG. 9 is a front view of the cathode assembly of FIG. 8.

Referring to FIGS. 8 to 10, the cathode assembly 33 includes a cylindrical retainer shield 35 that defines a passage of circular cross-section and has a threaded bore 36 at one end of the passage and a radially directed rib 37 within the passage.

The cathode assembly 33 also includes a cathode 38 of cylindrical cross-sectional shape that extends into the shield 35, as shown in FIG. 10, in a concentric coaxial manner. The cathode 38 has an annular flange 39 at one end that extends radially outwardly thereof and abuts the rib of the shield 37 as indicated in FIG. 10. The cathode 38 also has a cavity 40 of cylindrical cross-section at one end and an end wall 41 that defines an end of the cavity 40.

The cathode assembly 33 also includes a collar 42 of tubular shape that has a threaded outer surface 43 that is threaded into the bore 36 of the shield 35. In use, the collar 42 is threaded into abutment against the cathode 38 to secure the flange 39 of the cathode 38 between the rib 37 of the shield 35 and the collar 42.

Referring to FIGS. 5, 11 and 12, the filament clamp assembly 10 is mounted directly to the insulator block 26 via the four sets of screws 27 and nuts 28 and the graphite support plate 34 is disposed between the upper half of the insulator block 26 and the upper half of the filament clamp assembly 10. The graphite support plate 34 is secured to the insulator block 26 in any suitable manner, such as by bolts (not shown).

The graphite support plate 34 has an internally threaded opening 44 to receive the threaded collar 42 of the cathode assembly 33. As indicated in FIG. 11, the cathode assembly 33 is disposed above the insulator block 26. In addition, the filament 15 is disposed coaxially of the cathode assembly 33 and passes through the opening 44 in the graphite support plate 34.

In order to assemble the components, the graphite support plate 34 is mounted on the insulator block 26. Next, if not already in place, the cathode assembly 33 is threaded into the opening 44 in the support plate 34.

Thereafter, with the filament 15 in place, the filament clamp assembly 10 is positioned in alignment with the insulator block 26 and the filament 15 is passed through the aperture 44 in the support plate 34 and into the cavity 40 of the cathode 38.

The filament clamp assembly 10 is then secured to the insulator block 26 via the set screws 27 and nuts 28. When the assembly 10 is tightened in place, the matching tapered surfaces between the screws 27 and the clamps 11, 12 and the nuts 28 and the insulator block 26, respectively, self-align the clamps 11, 12 to the insulator block 26 thereby self-aligning the filament 15 inside the cavity 40 defined by the cathode 38. No other positioning of the filament clamp assembly 10 is required.

Referring to FIG. 12, when assembled, the correct gap G, typically 0.040 inches, between the filament 15 and the cathode 38 is created, thereby being self-positioning. There is a tolerance associated with the 0.04 dimension; the source will function in the range of 0.03 to 0.05 inches. Assembly of the cathode 38 in accordance with the self-positioning aspects of the cathode and the self-positioning aspects of the filament clamp assembly 10 achieves the 0.04 nominal dimension without adjustment of the components by the operator.

Referring to FIGS. 8 to 10, the cathode 38 has a smooth unthreaded outer surface and is made of tungsten. The collar 42 is made of graphite and the shield 35 is made of one of tungsten, molybdenum and graphite. Prior art cathodes in tungsten are a single piece construction equivalent to a combination of the threaded collar 42 and cathode 38.

The improved cathode 38 is ⅓ shorter in length than the prior art cathode. The shorter length cathode 38 restricts heat loss away from the arc chamber of an ion implanter.

The improved cathode 38 is not threaded as threading is proven to be a difficult machining operation in tungsten.

The graphite collar 42 is made from a material with lower thermal conductance than tungsten which also restricts heat loss away from the arc chamber.

The solid design of the cathode assembly 33 does not allow loss of gas or plasma from the arc chamber or expose the filament 15 to the plasma, common to prior art cathodes with openings or slots designed to restrict heat loss.

The invention thus provides a secure repeatable filament clamp assembly for holding the filament of an ion source. Replacement of a filament 15 may be readily performed by loosening the socket head nuts 14 to allow the recesses 18, 19 to move apart and release the connecting leads 16, 17 of the filament 15. With a fresh filament in place, the socket heads nuts 14 can be re-tightened. This procedure also reduces the downtime for servicing an ion implanter.

The invention also provides a filament clamp assembly which is self aligning to the cathode assembly of an ion source, reduces the complexity of the filament clamp assembly and which is retrofitable to various existing ion implanters.

The invention further provides a cathode assembly for an ion implanter that is self-positioning.

The invention further reduces the heat loss from the cathode of an ion implanter thereby reducing the heat loss from an arc chamber and increasing the efficiency of the arc chamber as well as the efficiency and lifetime of a filament of an ion implanter.

What is claimed is:

1. A filament clamp assembly comprising
a pair of clamps disposed in parallel relation, each said clamp having a bifurcated end defining a slot and including a first half having a threaded bore and a first recess in an end thereof and a second half having a through bore in alignment with said threaded bore and a second recess in an end thereof parallel to said first recess;
a pair of socket head set screws, each said set screw being threaded into said threaded bore of a respective clamp of said pair of clamps and extending outwardly of said through bore of a respective clamp of said pair of clamps; and
a pair of socket head nuts, each said nut being threaded onto a respective set screw into abutment with a respective clamp of said pair of clamps whereby in response to threading of a respective head nut onto a respective set screw and abutment against a respective clamp, said first half and said second half of the respective clamp move towards each other to narrow said slot therebetween and move said first recess and said second recess towards each other to clamp a connecting lead of a filament therebetween.

2. A filament clamp assembly as set forth in claim 1 wherein each socket head nut of said pair of socket head nuts has a tapered outer surface.

3. A filament clamp assembly as set forth in claim 1 further comprising a filament having a first connecting lead mounted in and between said first recess and said second recess of one of said pair of clamps, a second connecting lead mounted in and between said first recess and said second recess of the other of said pair of clamps, and a loop extending between said first connecting lead and said second connecting lead.

4. A cathode assembly comprising
a retainer shield defining a passage of circular cross-section and having a threaded bore at one end of said passage and a radially directed rib within said passage;
a cathode of cylindrical cross-sectional shape extending into said shield, said cathode having an annular flange at one end extending radially outwardly thereof and abutting said rib of said shield; and
a collar threaded into said bore of said shield against said cathode to secure said flange of said cathode between said rib of said shield and said collar.

5. A cathode assembly as set forth in claim 4 wherein said cathode has a smooth unthreaded outer surface.

6. A cathode assembly as set forth in claim 4 wherein said cathode is made of tungsten, said collar is made of graphite and said shield is made of one of tungsten, molybdenum and graphite.

7. A cathode assembly as set forth in claim 4 wherein said cathode has a cavity at one end of cylindrical cross-section.

8. An ion implanter comprising
a cathode assembly including a retainer shield defining a passage and having a threaded bore at one end of said passage and a radially directed rib within said passage, a cathode extending into said shield and having an annular flange abutting said rib of said shield and a cavity at one end; and a collar threaded into said bore of said shield against said cathode to secure said flange of said cathode between said rib of said shield and said collar;
a filament clamp assembly secured with said cathode assembly; and
a filament having a pair of parallel connecting leads secured in and extending from said clamp assembly into said cavity of said cathode and a loop extending between said connecting leads within said cavity of said cathode.

9. An ion implanter as set forth in claim 8 wherein said filament is disposed in said cavity of said cathode coaxially of said cathode.

10. An ion implanter as set forth in claim 8 cathode has an end wall defining an end of said cavity and said loop of said filament is spaced from end wall a distance of 0.04 inches.

11. An ion implanter as set forth in claim 8 further comprising
an insulator block having said filament clamp assembly mounted thereon in self-aligning relation.

12. An ion implanter as set forth in claim 11 wherein said filament clamp assembly includes a pair of clamps disposed in parallel relation, each said clamp having openings with a tapered entry, said insulator block has a plurality of openings with a tapered surface and further comprising a plurality of socket head screws having a tapered surface mating with a respective tapered entry and a plurality of tapered socket head nuts mating with a respective tapered surface of said insulator block.

13. An ion implanter as set forth in claim 11 further comprising a graphite support plate mounted on said insulator block between said filament clamp assembly and said insulator block, said graphite support plate having an opening receiving said collar of said cathode assembly and having said filament pass through said opening into said cavity of said cathode.

14. An ion implanter comprising
a filament clamp assembly including a pair of clamps disposed in parallel relation, each said clamp having openings with a tapered entry;

an insulator block having a plurality of openings with a tapered surface;
a plurality of socket head screws, each said screw having a tapered surface mating with a respective tapered entry in a respective clamp; and
a plurality of tapered socket head nuts, each said nut mating with a respective tapered surface of said insulator block and being threaded on a respective socket head screw.

* * * * *